United States Patent
Liu et al.

(10) Patent No.: US 9,118,318 B2
(45) Date of Patent: Aug. 25, 2015

(54) DRIVING CIRCUIT AND DRIVING METHOD (71) Applicant: MStar Semiconductor, Inc., Hsinchu Hsien (TW)

(72) Inventors: Hsian-Feng Liu, Hsinchu Hsien (TW); Eer-Wen Tyan, Hsinchu Hsien (TW); Chao-An Chen, Hsinchu Hsien (TW)

(73) Assignee: MStar Semiconductor, Inc., Hsinchu Hisen (TW)

( * ) Notice: Subject to any disclaimer, the term of this patent is extended or adjusted under 35 U.S.C. 154(b) by 0 days.

(21) Appl. No.: 14/661,106

(22) Filed: Mar. 18, 2015

(65) Prior Publication Data

US 2015/0194958 A1 Jul. 9, 2015

Related U.S. Application Data (62) Division of application No. 13/934,492, filed on Jul. 3, 2013.

(30) Foreign Application Priority Data

Aug. 3, 2012 (TW) .............................. 101128008 A (51) Int. Cl.
*H03K 3/00* (2006.01)
*H03K 19/0175* (2006.01)

(52) U.S. Cl.
CPC ................................ *H03K 19/0175* (2013.01)

(58) Field of Classification Search
CPC .................. H03K 19/00361; H03K 19/00315; H03K 19/0013; H04L 25/028; H04L 25/0272; B23K 11/248; G05F 1/52; G05F 1/42
USPC ......... 327/108–112, 306–310, 313, 327, 328, 327/333; 326/82, 83; 323/318, 349, 350, 323/352–354; 307/80
See application file for complete search history.

(56) References Cited

U.S. PATENT DOCUMENTS

| | | | |
|---|---|---|---|
| 8,179,160 B1 * | 5/2012 | Chauhan et al. ................ | 326/83 |
| 2008/0084195 A1 | 4/2008 | Frew et al. | |
| 2011/0298289 A1 | 12/2011 | Lee | |
| 2012/0008240 A1 | 1/2012 | Jiang et al. | |

* cited by examiner

*Primary Examiner* — Lincoln Donovan
*Assistant Examiner* — Thomas Skibinski
(74) *Attorney, Agent, or Firm* — Edell, Shapiro & Finnan, LLC (57) ABSTRACT

A driving circuit includes a first driving module, configured to operate at a first operating voltage in a first mode and configured to be deactivated in a second mode; and a second driving module, wherein at least part of the second driving module operates at a protection voltage in the first mode and operates at a second operating voltage in the second mode, wherein the second operating voltage and the protection voltage are lower than the first operating voltage.

11 Claims, 8 Drawing Sheets

FIG. 8

DRIVING CIRCUIT AND DRIVING METHOD

CROSS REFERENCE TO RELATED APPLICATIONS

This application is a Divisional of application Ser. No. 13/934,492, filed Jul. 3, 2103, which claims priority under 35 U.S.C 119 to Taiwan patent application, TW101128008, filed on Aug. 3, 2012, the disclosures of which are incorporated herein by reference.

BACKGROUND OF THE INVENTION

1. Field of the Invention

The present invention relates to a driving circuit and related driving method, and more particularly, to a driving circuit and driving method operating at multiple operating voltages.

2. Description of the Prior Art

Figure 1:
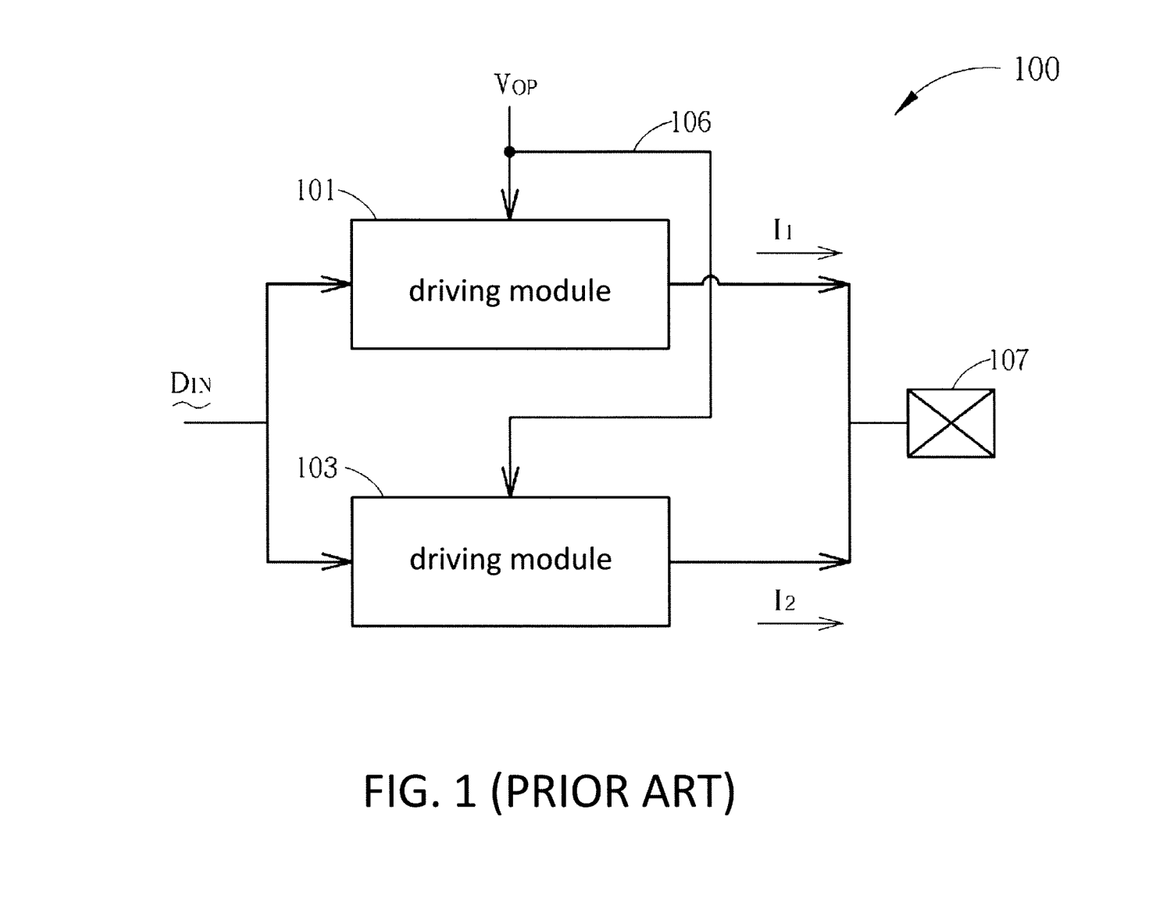
FIG. 1 illustrates a block diagram of a driving circuit in the prior art.

FIG. 1 illustrates a block diagram of a driving circuit 100 in the prior art. As shown in FIG. 1, the driving circuit 100 comprises driving modules 101 and 103. Driving currents $I_1$ and $I_2$ are generated and outputted to a connection pad 107 according to an input signal $D_{IN}$. The driving circuit 100 includes an operating voltage receiving end 106 to receive operating voltage $V_{OP}$ for the driving modules 101 and 103. The driving circuit 100 may be used to drive various electronics. Therefore the driving modules 101 and 103 are usually designed for various electronics such that one of them is adapted to operate in higher voltage and the other is adapted to operate in lower voltage. Furthermore, the operating voltage $V_{OP}$ can be varied depending on the electronic device in which the driving modules are disposed. For example, when the driving circuit 100 is used to drive LPDDR1 (low power double data rate memory 1 applicable to mobile devices), the operating voltage $V_{OP}$ is 1.8V. When the driving circuit 100 is used to drive LPDDR2 (low power double data rate memory 2 applicable to mobile devices), the operating voltage $V_{OP}$ is 1.2V. Assuming the driving module 101 is the component operating in higher voltage, e.g., 1.8V. And the driving module 103 is the component operating in lower voltage, e.g., 1.2V.

In operations in the prior art, the driving module 101 is deactivated and the driving module 103 is activated if the operating voltage $V_{OP}$ is 1.2V. Conversely, if the operating voltage $V_{OP}$ is 1.8V, the driving module 101 is activated and the driving module 103 is deactivated to self-protect from higher voltage. However, the input signal $D_{IN}$ is not fixed and varies from time to time. As a result, the driving module 103 cannot be fully deactivated and some current is leaked. If realizing the driving module 103 by elements capable of operating in higher voltage, circuit size would be increased accordingly.

From the above it is clear that prior art still has shortcomings. Thus, there is a need in the industry for a novel technique that solves these problems.

SUMMARY OF THE INVENTION

One of objectives of the present invention is to provide a driving circuit and driving method operating at different operating voltages.

One embodiment of the present invention provides a driving circuit, comprising: a first driving module, configured to operate at a first operating voltage in a first mode and configured to be deactivated in a second mode; and a second driving module, wherein at least part of the second driving module operates at a protection voltage in the first mode and operates at a second operating voltage in the second mode, wherein the second operating voltage and the protection voltage are lower than the first operating voltage.

According to the embodiment, a driving method can be concluded. The steps of the driving method can be derived accordingly. No further description is elaborated here.

According to the aforementioned embodiments, by providing protection voltage in a mode operating in higher voltage, the driving circuit can function properly in different operating voltages without increasing circuit area.

The above description is only an outline of the technical schemes of the present invention. Preferred embodiments of the present invention are provided below in conjunction with the attached drawings to enable one with ordinary skill in the art to better understand said and other objectives, features and advantages of the present invention and to make the present invention accordingly.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Some embodiments of the present invention are described in details below. However, in addition to the descriptions given below, the present invention can be implemented in alternative ways, and the scope of the present invention is not limited other than by the scope of the claims. Moreover, for better understanding and clarity of the description, some components in the drawings may not necessarily be drawn to scale, wherein some may be exaggerated relative to others, and irrelevant parts are omitted.

Figure 2:
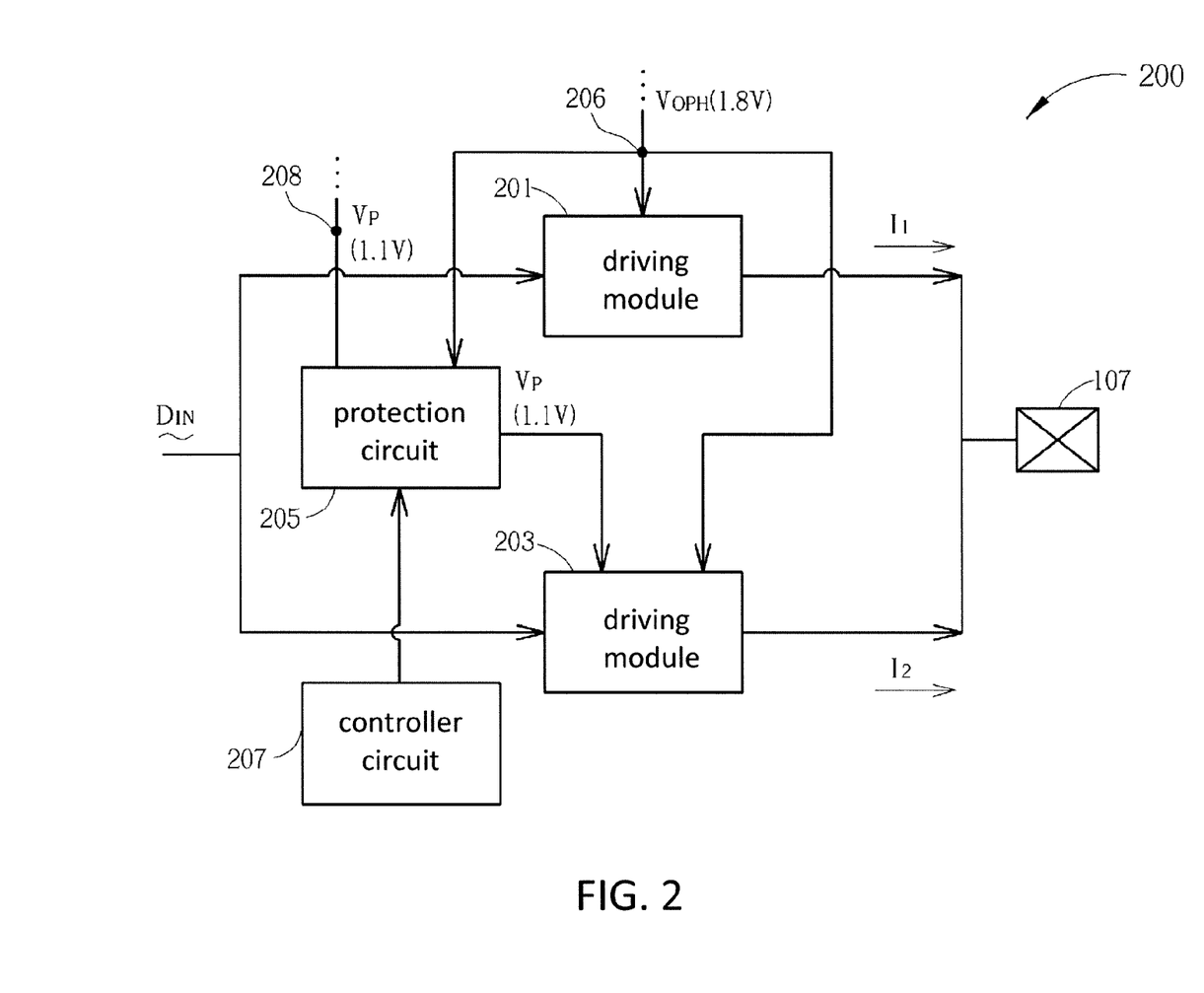
FIG. 2 depicts a block diagram of a driving circuit operating in a first mode in accordance with an embodiment of the present invention.

FIG. 2 depicts a block diagram of driving circuit 200 operating in a first mode in accordance with an embodiment of the present invention. Note that although the embodiment operating at 1.8V and 1.2V as in the prior art, it does not mean that the driving circuit 200 can only operate at these two voltages. Those skilled in the art will understand that the driving circuit 200 can be configured to adapt to various electronic devices or components to be driven. As shown in FIG. 2, the driving circuit 200 comprises driving modules 201 and 203 as well as protection circuit 205. The driving module 201 is a component capable of operating at higher voltage. It works properly at 1.8V. The driving module 203 is a component which may not sustain higher voltage; it is configured to function at 1.2V.

In a first mode, the operating voltage $V_{OPH}$ received by an operating voltage receiving end 206 is 1.8V. The driving module 201 receives the operating voltage $V_{OPH}$ and operates at the operating voltage $V_{OPH}$. In the first mode, the protection circuit 205 receives the operating voltage $V_{OPH}$ and outputs protection voltage $V_P$ (e.g., 1.1V in this embodiment) to at least part of the driving module 203. Consequently, the at least part of the driving module 203 operates at the protection voltage $V_P$ and is protected from higher operating voltage $V_{OPH}$. And, the driving module 203 is able to keep activated. Therefore no current leakage problem as in the prior art happens.

Figure 3:
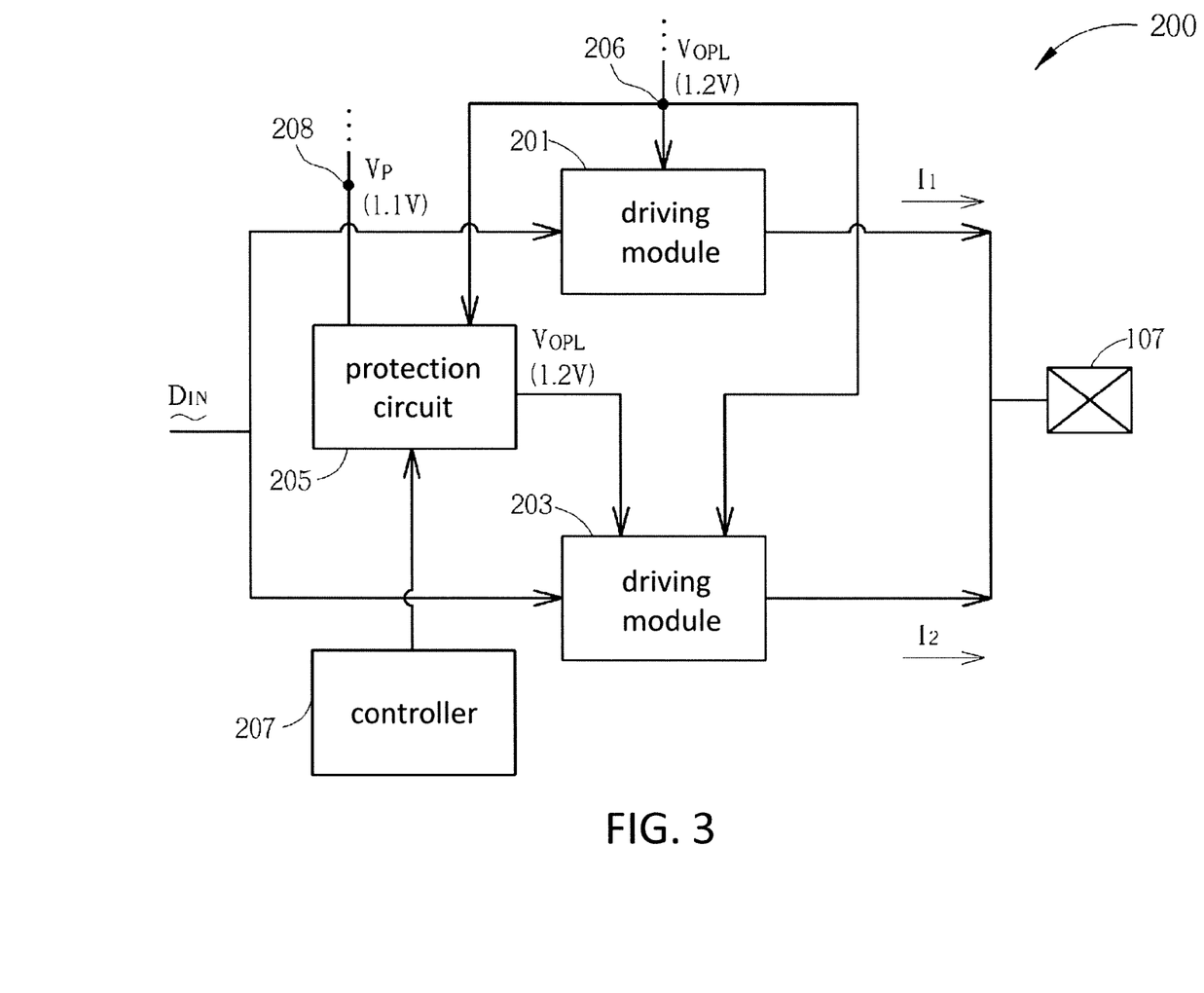
FIG. 3 depicts a block diagram of a driving circuit operating in a second mode in accordance with an embodiment of the present invention.

FIG. 3 depicts a block diagram of driving circuit 200 operating in a second mode in accordance with an embodiment of the present invention. In the second mode, the operating voltage $V_{OPL}$ received by the operating voltage receiving end 206 is 1.2V. The driving module 201 is deactivated. Since the driving module 203 is able to operate normally at 1.2V, the protection circuit 205 outputs the operating voltage $V_{OPL}$ to the driving module 203 such that the driving module 203 operates at the operating voltage $V_{OPL}$. The protection circuit 205 receives control signal CS from a controller circuit 207 in order to output the protection voltage $V_P$ or the operating voltage $V_{OPL}$, selectively. In one embodiment, the controller circuit 207 is coupled to the operating voltage receiving end 206 for detecting voltage of the operating voltage. According to the detected voltage, the controller circuit 207 controls the protection circuit 205 for outputting the protection voltage $V_P$ or the operating voltage $V_{OPL}$. It is noted that any other control mechanism that functions equivalently may be used in other embodiments of the present invention. The controller circuit 207 may be a hardware circuit. Alternatively, it may be implemented as a microprocessor executing firmware to fulfill the functions of the controller circuit 207.

It is noted that the embodiments are merely used to explain but not to limit the scope of the present invention. Already described above, the driving circuit 200 is not limited to operate at the 1.8V and 1.2V combination. Further, the protection voltage $V_P$ is not limited to 1.1V. As long as the operating voltage $V_{OPH}$ is larger than the operating voltage $V_{OPL}$ and the protection voltage $V_P$ is smaller than or equaling to the operating $V_{OPL}$, the voltages $V_{OPH}$, $V_{OPL}$, and $V_P$ can be any values. In addition, the protection voltage $V_P$ may be received by the protection circuit 205 as shown in FIG. 2 or FIG. 3. In one embodiment, the protection circuit 205 may block the operating voltage $V_{OPH}$ and output the received protection voltage $V_P$. Alternatively, the protection circuit 205 may adjust the operating voltage $V_{OPH}$ to generate the protection voltage $V_P$. These alternatives fall within the scope of the present invention.

Figure 4:
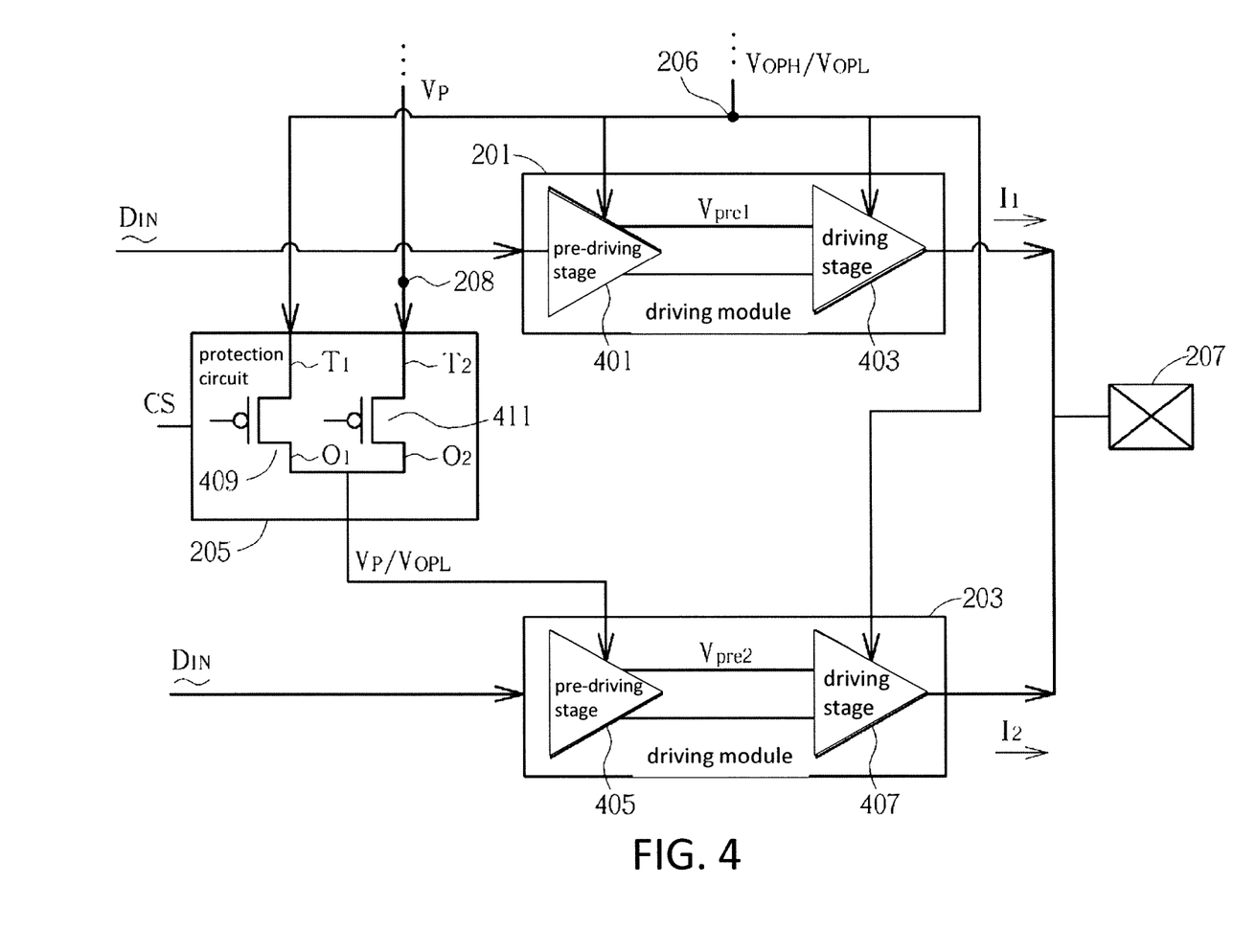
FIG. 4 and FIG. 5 depict detail circuit diagrams of the driving modules and the protection circuit shown in FIG. 2 and FIG. 3.
Figure 5:
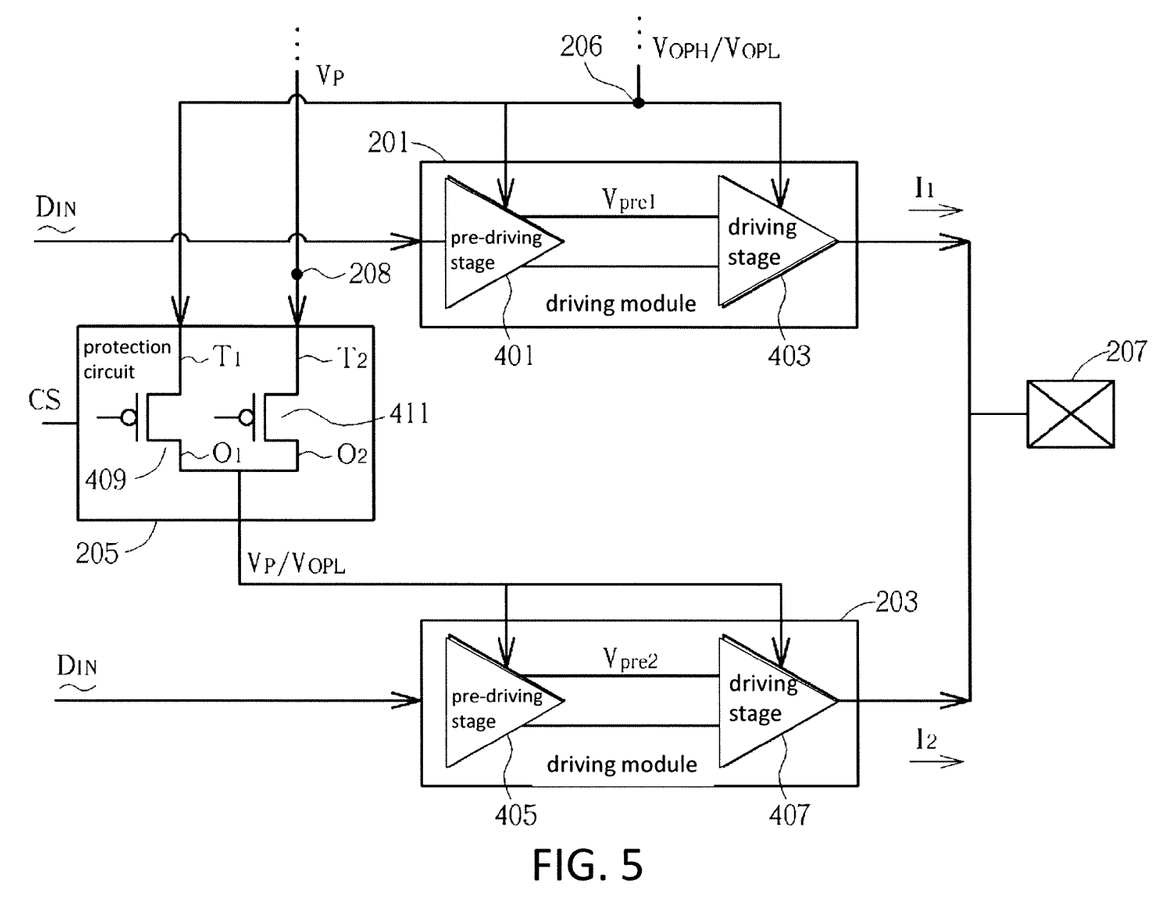

FIG. 4 depicts a detail circuit diagram of the driving modules and the protection circuit shown in FIG. 2 and FIG. 3. As shown in FIG. 4, the driving module 201 comprises a pre-driving stage 401 and a driving stage 403. The driving module 203 comprises a pre-driving stage 405 and a driving stage 407. The pre-driving stages 401 and 405 generate pre-driving voltages $V_{pre1}$ and $V_{pre2}$ according to voltage of the input signal $D_{IN}$, respectively. The driving stages 403 and 407 generate driving currents $I_1$ and $I_2$ according to pre-driving voltages $V_{pre1}$ and $V_{pre2}$, respectively. In one embodiment, the pre-driving stage 401 and 405 are level shifters configured to adjust the input voltage level and to generate the pre-driving voltages $V_{pre1}$ and $V_{pre2}$, respectively. At least one of the pre-driving stage 405 and the driving stage 407 of the driving module 203 operates at the protection voltage $V_P$ in the first mode and operates at the operating voltage $V_{OPL}$ in the second mode. Different interconnections of the driving module 203 are shown in FIG. 4 and FIG. 5, respectively. As shown in FIG. 4, only the pre-driving stage 405 is coupled to the protection circuit 205. The driving stage 407 is coupled to the operating voltage receiving end 206. As a result, only the pre-driving stage 405 is protected. The protected pre-driving stage 405 operates at the protection voltage $V_P$ in the first mode and operates at the operating voltage $V_{OPL}$ in the second mode. Similarly to the driving module 203, the driving stage 407 operates at the operating voltage $V_{OPH}$ in the first mode and operates at the operating voltage $V_{OPL}$ in the second mode. An alternative embodiment is shown in FIG. 5, wherein both stages are protected. In summary, various components of the driving module may be protected with respect to different designs or requirements in accordance with the concepts disclosed by the present invention. It is noted that interconnection of components shown in FIG. 4 corresponds to interconnections of components shown in FIG. 2 and FIG. 3. Those skilled in the art will appreciate how to design or modify the component interconnection of the embodiment shown in FIG. 5 according to interconnections of components shown in FIG. 2 and FIG. 3. Therefore, no further description is elaborated here.

In the embodiments shown in FIG. 4 and FIG. 5, protection circuit 205 comprises switch elements 409 and 411 which work according to the control signal CS. The switch element 409 has an input end $T_1$ coupled to the operating voltage receiving end 206 and an output end $O_1$ coupled to the driving module 203. In the first mode, the switch element 409 maintains an open circuit between the input end $T_1$ and the output end $O_1$ such that the operating voltage $V_{OPH}$ cannot be outputted. In the second mode, the switch element 409 maintains a closed circuit between the input end $T_1$ and the output end $O_1$ such that the operating voltage $V_{OPL}$ can be outputted. The switch element 411 has an input end $T_2$ coupled to the protection voltage receiving end 208 and an output end $O_2$ coupled to the driving module 203. In the first mode, the switch element 411 maintains a closed circuit between the input end $T_2$ and the output end $O_2$ such that the protection voltage $V_P$ can be outputted. In the second mode, the switch element 411 maintains an open circuit between the input end $T_2$ and the output end $O_2$ such that the operating voltage $V_P$ cannot be outputted.

Figure 6:
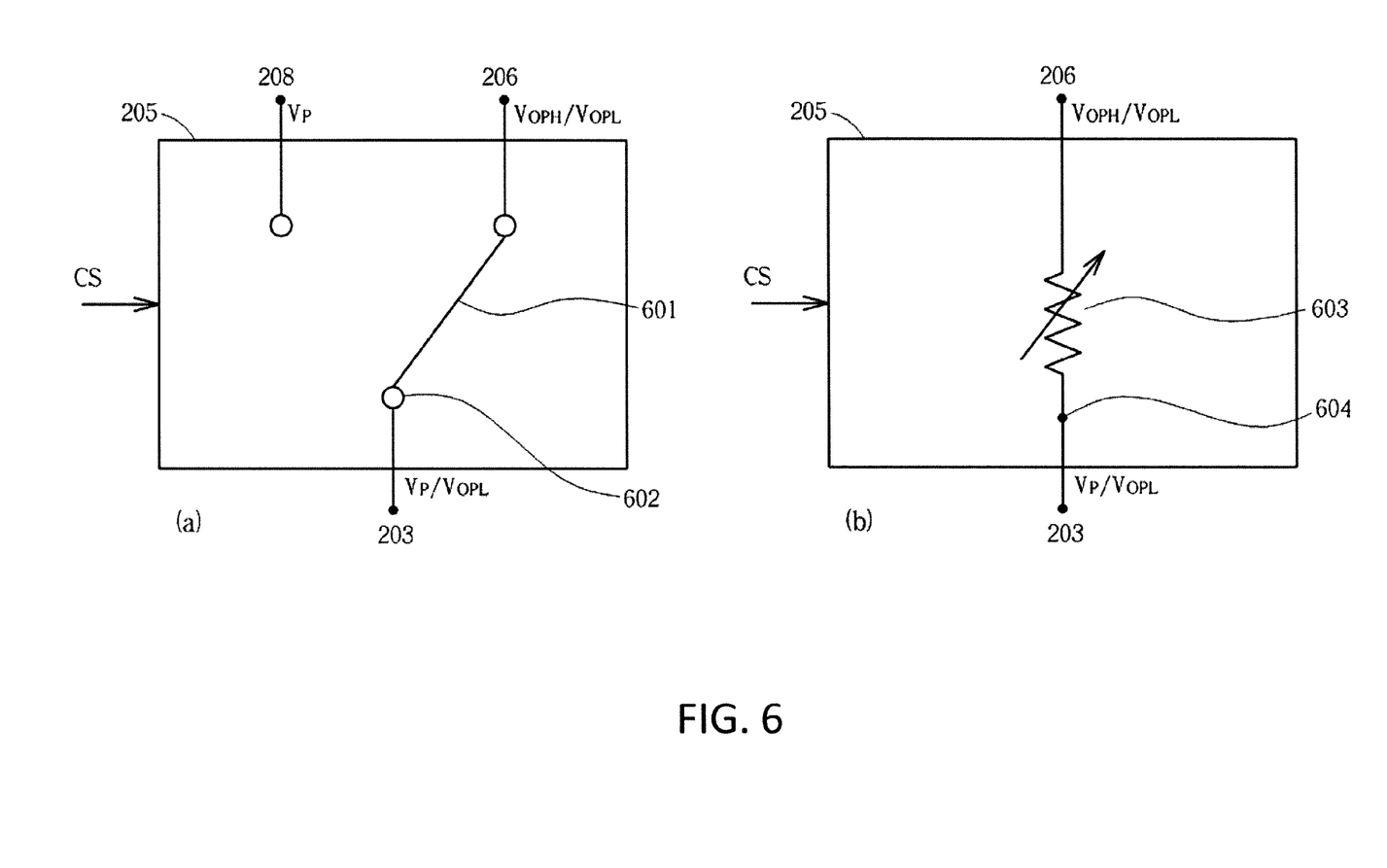
FIG. 6 shows a diagram of an exemplary circuit of the protection circuit.

The protection circuit 205 is not limited to the structures shown in FIG. 4 and FIG. 5. Take the example shown in FIG. 6(a), the protection circuit 205 comprises a switch element 601 and an output end 602. The output end 602 is configured to output the protection voltage $V_P$ or the operating voltage $V_{OPL}$ to the driving module 203. The switch element 601 is controlled by the control signal CS and switches between the operating voltage receiving end 206 and the protection voltage receiving end 208. More specifically, the switch element 601 connects the protection voltage receiving end 208 with the output end 602 in the first mode and connects the operating voltage receiving end 206 with the output end 602 in the second mode.

Already described in paragraphs above, the protection circuit 205 may receive the protection voltage $V_P$ as shown in FIG. 2 and FIG. 3. In the first mode, the protection circuit 205 blocks the operating voltage $V_{OPH}$ and outputs the received protection voltage $V_P$. Alternatively, the protection circuit 205 may adjust the operating voltage $V_{OPH}$ to generate the protection voltage $V_P$. As shown in the FIG. 6(b), the protection circuit 205 comprises a variable resistor 603 which has one end coupled to the operating voltage receiving end 206. The resistance of the variable resistor 603 is adjustable depending on operating in the first mode or in the second mode such that the protection circuit 205 is able to generate the protection voltage $V_P$ in the first mode and to generate the operating voltage $V_{OPL}$ in the second mode. The resistance of the variable resistor 603 is also controlled by the control signal CS generated from the controller circuit 207. That is, the variable resistor 603 can be viewed as a voltage adjustment element which adjusts the received first operating voltage $V_{OPH}$ to the protection voltage $V_P$ and outputs to an output end 604 in the first mode, and receives a second operating voltage $V_{OPL}$ and outputs to the output end 604 in the second mode. Any other elements functions the same may replace the voltage adjustment element.

Figure 7:
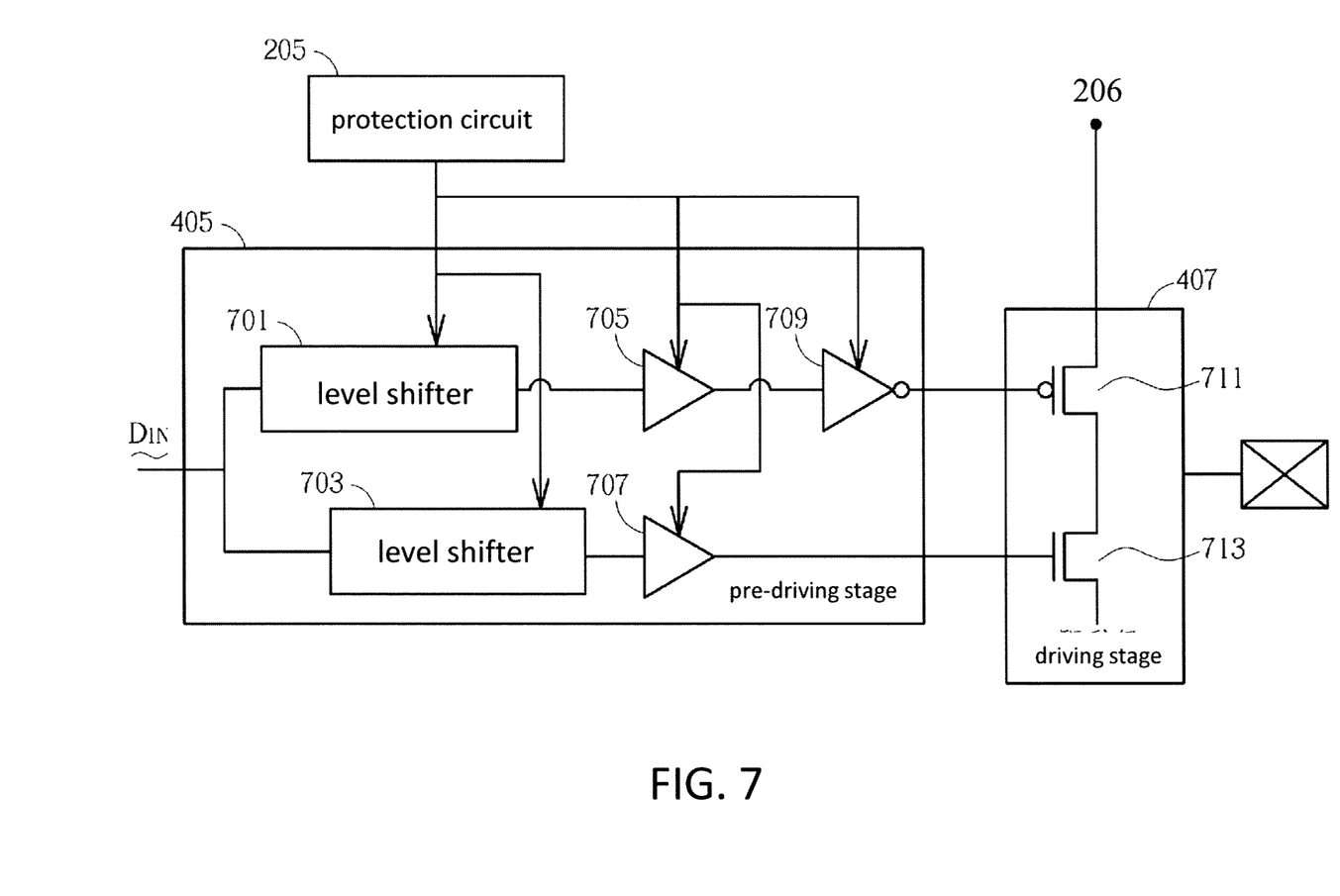
FIG. 7 illustrates a diagram of a detailed circuit of the pre-driving stage and the driving stage shown in FIG. 4.

FIG. 7 illustrates a diagram of detailed circuit of the pre-driving stage and the driving stage shown in FIG. 4. As shown in FIG. 7, the pre-driving stage 405 comprises level shifters 701 and 703, buffers 705 and 707, and a phase inverter 709. The driving stage 407 comprises P-MOSFET (Positive Metal Oxide Semiconductor Field Effect Transistor) 711 and N-MOSFET 713. The level shifters 701 and 703 are configured to adjust voltage level of the input signal $D_{IN}$. The buffers 705 and 707 are configured to increase driving force of voltages generated by the level shifters 701 and 703. The phase inverter 709 is arranged to cause the P-MOSFET 711 and the N-MOSFET 713 to be conductive or non-conductive at the same time. The detailed circuit shown in FIG. 7 is applicable to the embodiment shown in the FIG. 4. Therefore elements in the pre-driving stage 405 are coupled to the protection circuit 205 and elements in the driving stage 407 are coupled to the operating voltage receiving end 206. The circuit structure shown in the FIG. 7 is also applicable to the embodiment shown in the FIG. 5. Those skilled in the art will appreciate how the interconnection of elements shown in FIG. 7 applies to the embodiment shown in FIG. 5 according to the descriptions of FIG. 5 and FIG. 7. Therefore, no further description is elaborated here.

According to the aforementioned embodiments, a driving method is concluded accordingly. The method comprises steps shown in FIG. 8.

Figure 8:
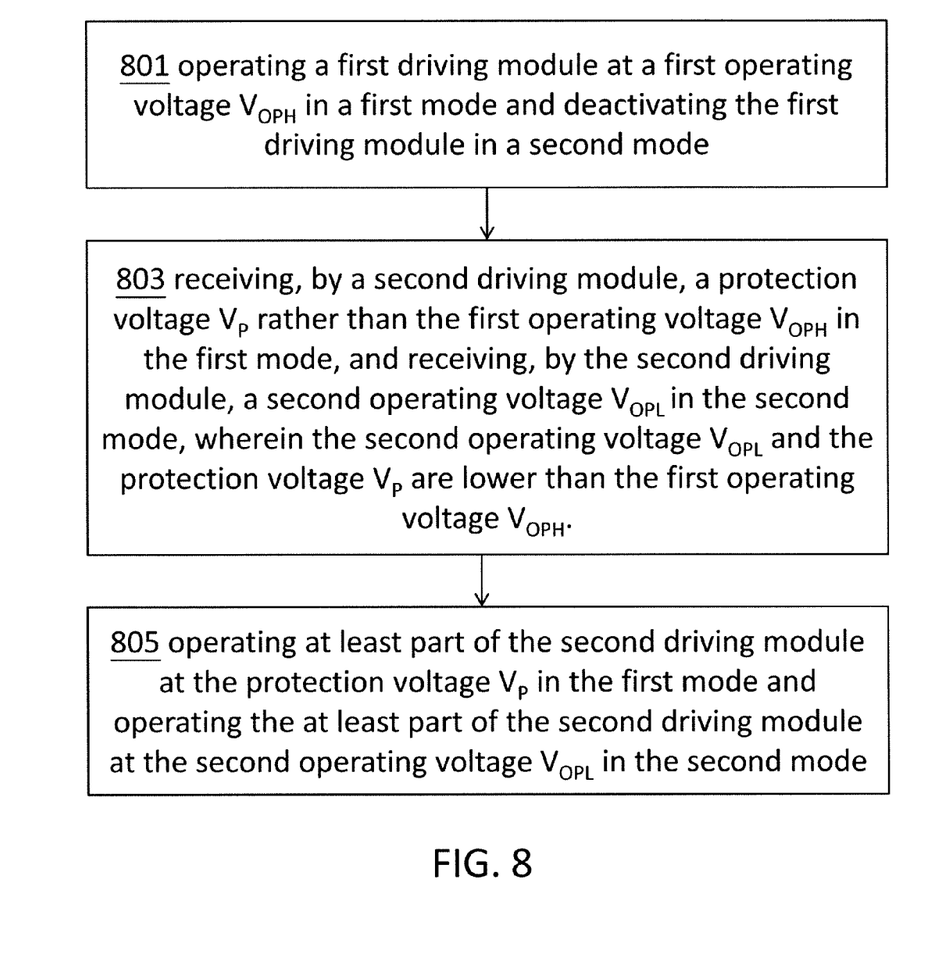
FIG. 8 illustrates a flowchart of a driving method in accordance with an embodiment of the present invention.

Step 801: operating a first driving module (e.g., the driving module 201) at a first operating voltage $V_{OPH}$ in a first mode and deactivating the first driving module in a second mode.

Step 803: receiving, by a second driving module (e.g., the driving module 203), a protection voltage $V_P$ rather than the first operating voltage $V_{OPH}$ in the first mode, and receiving, by the second driving module, a second operating voltage $V_{OPL}$ in the second mode, wherein the second operating voltage $V_{OPL}$ and the protection voltage $V_P$ are lower than the first operating voltage $V_{OPH}$.

Step 805: operating at least part of the second driving module at the protection voltage $V_P$ in the first mode and operating the at least part of the second driving module at the second operating voltage $V_{OPL}$ in the second mode.

According to the fore-mentioned embodiments, by providing protection voltage in a mode operating at higher voltage, the driving circuit can function properly at different operating voltages without increasing circuit area.

The above embodiments are only used to illustrate the principles of the present invention, and they should not be construed as to limit the present invention in any way. The above embodiments can be modified by those having ordinary skill in the art without departing from the scope of the present invention as defined in the following appended claims.

What is claimed is:

1. A driving circuit, comprising:
a first driving module, configured to operate at a first operating voltage in a first mode and configured to be deactivated in a second mode; and
a second driving module, wherein at least part of the second driving module operates at a protection voltage in the first mode and operates at a second operating voltage in the second mode, wherein the second operating voltage and the protection voltage are lower than the first operating voltage,
wherein the second driving module further comprises:
a pre-driving stage, configured to generate a pre-driving voltage according to an input voltage; and
a driving stage, configured to generate a driving current according to the pre-driving voltage,
wherein only the pre-driving stage operates at the protection voltage in the first mode and operates at the second operating voltage in the second mode.

2. The driving circuit of the claim 1, wherein the protection voltage is not larger than the second operating voltage.

3. The driving circuit of the claim 1, wherein the driving stage operates the first operating voltage only.

4. The driving circuit of the claim 3, wherein the pre-driving stage comprises a level shifter configured to adjust the input voltage to generate the pre-driving voltage.

5. The driving circuit of the claim 1, further comprising:
a protection circuit, configured to receive the first operating voltage and to provide the protection voltage to the second driving module in the first mode and configured to receive the second operating voltage and to provide the second operating voltage to the second driving module in the second mode.

6. The driving circuit of the claim 5, further comprising:
an operating voltage receiving end, configured to receive the first operating voltage in the first mode and to receive the second operating voltage in the second mode; and
a protection voltage receiving end, configured to receive the protection voltage;
wherein the protection circuit further comprises:
a first switch element having a first input end coupled to the operating voltage receiving end and a first output end coupled to the second driving module, configured to maintain an open circuit between the first input end and the first output end in the first mode and to maintain a closed circuit between the first input end and the first output end in the second mode; and
a second switch element having a second input end coupled to the protection voltage receiving end and a second output end coupled to the second driving module, configured to maintain a closed circuit between the second input end and the second output end in the first mode and to maintain an open circuit between the second input end and the second output end in the second mode.

7. The driving circuit of claim 5, further comprising:
an operating voltage receiving end, configured to receive the first operating voltage in the first mode and to receive the second operating voltage in the second mode; and
a protection voltage receiving end, configured to receive the protection voltage;
wherein the protection circuit further comprises:
an output end, configured to output one of the protection voltage and the second operating voltage to the second driving module; and
a switch element, configured to connect the protection voltage receiving end with the output end in the first mode and configured to connect the output end with the operating voltage receiving end in the second mode.

8. The driving circuit of claim 5, further comprising:
an operating voltage receiving end, configured to receive the first operating voltage in the first mode and to receive the second operating voltage in the second mode;
wherein the protection circuit further comprises:
  an output end, configured to output one of the protection voltage and the second operating voltage to the second driving module; and
  a voltage adjustment element, configured to receive the first operating voltage and adjust the first operating voltage to the protection voltage to the output end in the first mode and configured to receive the second operating voltage and to output the second operating voltage to the output end.

9. A driving method, comprising:
operating a first driving module at a first operating voltage in a first mode and deactivating the first driving module in a second mode;
receiving, by a second driving module, a protection voltage in the first mode and receiving, by the second driving module, a second operating voltage, wherein the second operating voltage and the protection voltage are lower than the first operating voltage; and
operating at least part of the second driving module at the protection voltage in the first mode and operating the at least part of the second driving module at the second operating voltage in the second mode,
wherein the second driving module further comprises:
a pre-driving stage, configured to generate a pre-driving voltage according to an input voltage; and
a driving stage, configured to generate a driving current according to the pre-driving voltage,
the driving method further comprises:
  operating the pre-driving stage only in the protection voltage in the first mode and operating the pre-driving stage or both of the pre-driving stage and the driving stage in the second operating voltage in the second mode.

10. The driving method of claim 9, wherein the protection voltage is not larger than the second operating voltage.

11. The driving method of claim 9, further comprising:
receiving the first operating voltage and generating the protection voltage by adjusting the first operating voltage.

* * * * *